United States Patent
Cole et al.

(10) Patent No.: US 6,803,134 B1
(45) Date of Patent: Oct. 12, 2004

(54) PARAELECTRIC THIN FILM MATERIAL AND METHOD STATEMENT OF GOVERNMENT INTEREST

(75) Inventors: Melanie W. Cole, Churchville, MD (US); Clifford Hubbard, Harve De Grace, MD (US); Eric Ngo, Bel Air, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/157,937

(22) Filed: May 31, 2002

(51) Int. Cl.$^7$ ................................................ B32B 9/00
(52) U.S. Cl. ....................... 428/701; 428/702; 501/137; 501/152; 427/126.3; 427/372.2
(58) Field of Search .......................... 427/126.3, 372.2; 501/137, 152; 428/699, 701, 702; 252/62.9 R, 62.9 PZ

(56) References Cited

U.S. PATENT DOCUMENTS 6,451,222 B1 * 9/2002 Li et al. ................ 252/62.9 R

OTHER PUBLICATIONS

Handerek, J., Field–Excited Electron Emission From Lanthanum–Doped Barium Strontium Titanate Ceramics, Ferroelectrics 1992, vol. 128 pp. 43–48.*

Rao, J.B.L., Patel; Naval Research Laboratory D.P., Sengupta, L.C., Synowczynski, J., Chiu, L.H., Ngo, E., and Sengupta, S., Army Research Laboratory. *Ferroelectric Materials for Phased Array Applications*. pp. 2284–2287.

Sengupta, L.C., Ngo, E., O'Day, M.E., Stowell, S., Lancto, R., U.S. Army Research Laboratory, *Fabrication and Characterization of Barium Strontium Tilanate Non–Ferroelectric Oxide Composites for use in Phased Array Antennas and Other Electronic Devices*, 1995, pp. 622–625.

Chang, Wontae, Horwitz, James S., Carter, Adriaan C., Pond, Jeffrey M., Kirchoefer, Steven W., Gilmore, Charles M., and Chirsey, Douglas B., Naval Research Laboratory, *The effect of annealing on the microwave properties of $Ba_{0.5}Sr_{0.5}TiO_3$ thin films*, 1999, pp. 1033–1035.

Knass, L.A., Pond, J.M., Horwitz, J.S., and Chrisey, D.B., Mueller, C.H. and Treece, Randolph, *The effect of annealing on the structure and dielectric properties of $Ba_xSr_{1-x}TiO_3$ ferroelectric thin firms*, 1996, pp. 25–27.

* cited by examiner

*Primary Examiner*—Arti R. Singh
*Assistant Examiner*—A B Sperty
(74) *Attorney, Agent, or Firm*—William V. Adams

(57) ABSTRACT

A dielectric thin film material and method of preparation in which precursors are provided to form barium strontium titanate with lanthanum (La) added as a dopant. The precursors and La dopant are mixed with a solvent forming a solution which is deposited on a substrate to form a continuous film composition. In various embodiments, the dielectric thin film has a composition of (1-y)$Ba_{0.6}Sr_{0.4}TiO_3$-(y)La, where y=0 to 10-mol. The thin film material has dielectric and insulating properties suitable for tunable microwave applications.

19 Claims, 6 Drawing Sheets

| La mol % | $\varepsilon_r$ | tanδ | Tunability (%) (at 200 kV/cm) | ρ($\times 10^{13}$Ω-cm) (at 100 kV/cm) |
|---|---|---|---|---|
| 0 | 450 | >0.025 | 28.1 | 0.04 |
| 1 | 283 | 0.019 | 12.1 | 31.4 |
| 5 | 204 | 0.019 | 3.49 | 31.4 |
| 10 | 200 | 0.030 | 1.2 | 1570 |

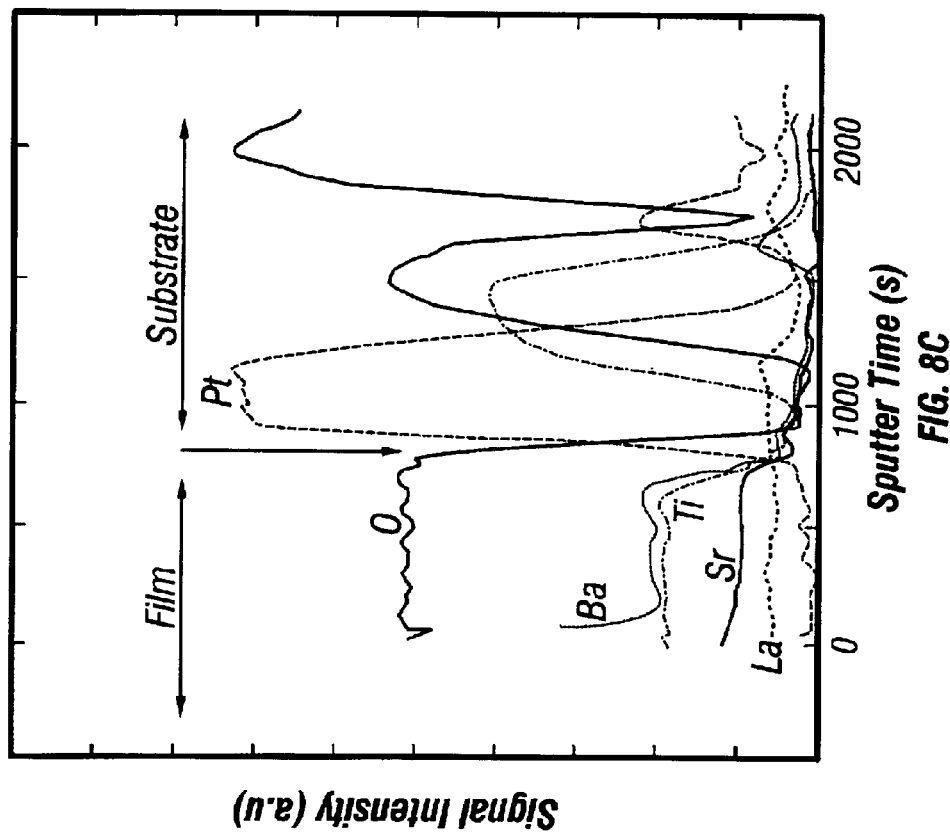
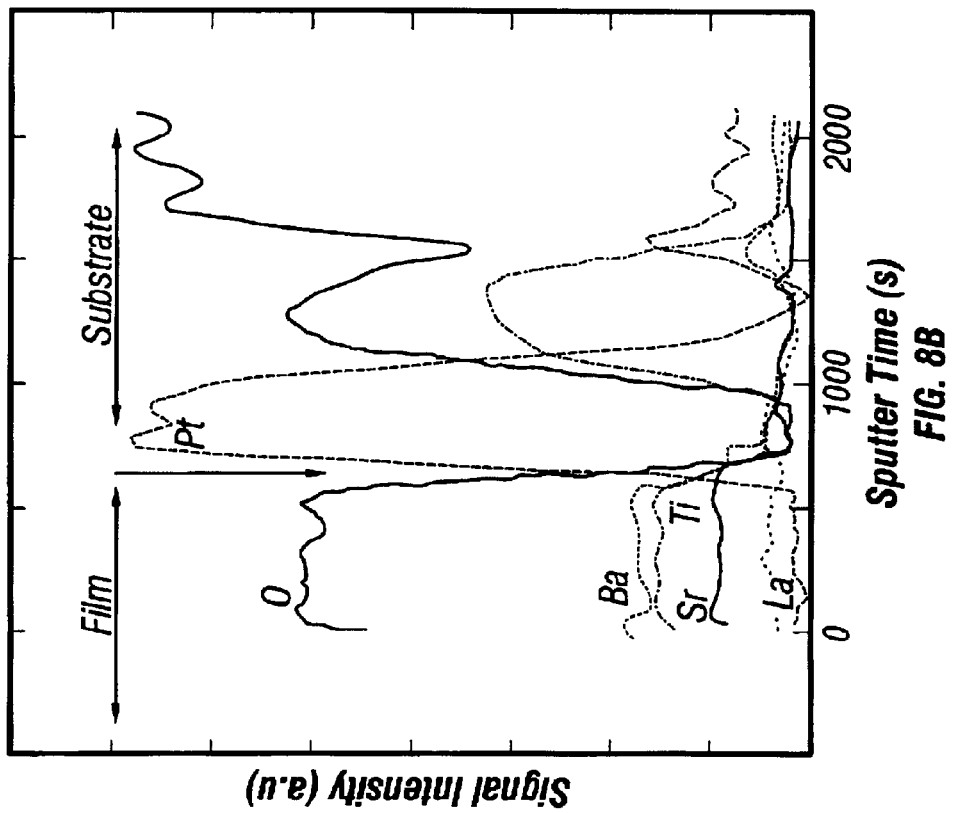

PARAELECTRIC THIN FILM MATERIAL AND METHOD STATEMENT OF GOVERNMENT INTEREST

STATEMENT OF GOVERNMENT INTEREST

The invention described herein may be manufactured, used and/or licensed by or for the Government of the United States of America.

BACKGROUND OF THE INVENTION

1. Field of the Invention

This invention relates generally to dielectric/paraelectric thin film material compositions and methods of preparation; and more particularly to dielectric/paraelectric thin film material compositions and methods for use in electronically tunable microwave device applications.

2. Discussion of the Related Art

There is a need for the design and fabrication of dielectric/paraelectric thin film materials having enhanced dielectric and insulating properties which may be adjusted for a particular use. Presently, expensive current driven ferrites, are used in phased array antennas. Enhanced tunability with minimal dielectric loss are important for paraelectric thin film composition materials. Additionally, dielectric materials having high dielectric constant and low dielectric loss at microwave frequencies are needed to minimize losses in a microwave system.

Phase array antennas can steer transmitted or received signals either linearly or in two dimensions without mechanically oscillating the antenna. In contrast to mechanical scanning, electronic scanning is achieved by the technical concept of changing the path-length in the material. In magnetic materials (e.g. ferrities) the path-length is changed by applying a current; this requires higher power (voltage and amps). Phase array antennas are currently constructed using ferrite phase shifting elements. Due to the type of circuit requirements necessary to operate these antennas, they are costly, large, and heavy.

Ferroelectric/paraelectric materials are advantageous over ferrite materials as phase shifters, namely: ferroelectric/paraelectric materials have lower power requirements because ferroelectric materials are voltage driven while ferrites are current driven. Ferroelectric/paraelectric materials allow faster phase shifting or faster switching speed compared to ferromagnetic materials (ferrite phase shifters are slow to respond to control signals and cannot be used in applications where rapid beam scanning is required). Additionally, ferrites are non-reciprocal meaning that there must be a separate transmitter and receiver while ferroelectric/paraelectric technology uses a single element both as transmitter and receiver for all frequencies. Semiconductor device phase shifters are also being developed for phased array antennas and they have faster response speeds than ferrite technology, however, a major drawback is that they have very high losses at microwave and millimeter-wave frequencies. Another disadvantage of semiconductor phase shifters is that they have limited power-handling capability. MEMS (microelectromechanical systems) based phase shifters are also being developed for scanning antenna applications, however the high cost of device packaging and poor reliability due to stickation and the under-developed process science for MEMS fabrication, makes them non-ideal candidates for affordable, reliable antenna applications.

Bulk ferroelectric materials are currently being developed as a replacement for the more expensive current driven ferrites, which are currently used in phased array antennas. The bulk ceramic material, $Ba_{1-x}Sr_xTiO_3$, barium strontium titanate, (BST), is a promising material for electronically tunable device applications such as electronically tunable mixers, delay lines, filters, capacitors, oscillators, resonators, and phase shifters. The tunability of this material arises because it is possible to change its dielectric constant with application of an electric field. The tunable dielectric constant results in a change in the phase velocity in the device allowing it to be tuned in real time for a particular application. Bulk ceramic BST phase shifters, in a microstrip geometry, have been demonstrated at 5–10 GHz. However, the relatively high loss tangent of these materials, especially at microwave frequencies, have precluded their use in phase shifter applications. The dielectric properties of theses bulk materials have been improved, that is, the loss tangents were reduced to less than 0.006 at 10 GHz. This reduction in loss tangent was achieved by the addition of MgO to form BST/MgO bulk ceramic composites. Utilization of these BST/MgO materials as phase shifting elements in this bulk ceramic form is still quite limited due to the large voltages, on the order of $\geq 1000$ V, needed to bias these bulk materials in a microstrip geometry.

In order to successfully employ BST based thin films in tunable device applications, such as phase shifters in phased array antennas, the dielectric and insulating properties should satisfy various material requirements. These requirements include: (1) a low loss tangent (tan $\delta$) over the range of operating dc bias voltages, (2) a large variation in the dielectric constant with applied dc bias, e.g., a high tunability, (3) for impedance matching purposes, the dielectric constant ($\epsilon_r$) should be less than 500, and (4) the film should possess low leakage current ($I_L$)/high film resistivity ($\rho$) characteristics. In addition to these primary material requirements, long-term reliability issues may also be considered. These reliability issues include: good stability of the dielectric and insulating properties over a broad range of frequency and temperature, and maximum reproducibility of the dielectric properties with respect to the applied dc bias, the film should be single phase with a dense microstructure and minimal defects, the films surface morphology should be smooth and crack free, and the film-substrate interface should be thermally stable as a function of processing temperature. It is desirable to have phase shifting materials with high tunability and minimum electronic loss (dissipation of microwave energy in the material).

Various thin film fabrication techniques have been attempted. $Ba_{1-x}Sr_xTiO_3$ thin films offer tunabilities upward of 50% at bias voltages of less than 10 V, which is compatible with the voltage requirements of present semiconductor based systems. Unfortunately, the tradeoff for such high tunabilities are high loss tangents, that is, tan $\delta$ much larger than 0.03. Ferroelectric thin films are fabricated via a variety of film fabrication techniques, namely, pulsed laser deposition (PLD) technique, sputtering deposition technique, metalorganic chemical vapor deposition (MOCVD) technique. PLD offers a quick method of film disposition with precise control of the films stoichiometry. PLD offers poor film uniformity, and undesirable nano-particles are commonly incorporated into the condensed film. Thus, PLD is considered a small area (0.5"×0.5") deposition method useful only for "screening material compositions" and it is difficult, if not impossible, to scale-up this deposition method to useful wafer diameters, e.g., ranging from 4 inch to larger than 6 inch diameters. Additionally, PLD is not an "industry standard" method for film fabrication used in the semiconductor industry.

Sputtering is an industry standard fabrication technique for semiconductor device fabrication. Although the sputtering technique is "industry standard" it is difficult to achieve the desired stoichiometry control required for fabrication of $Ba_{1-x}Sr_xTiO_3$ based thin films. Metalorganic chemical vapor deposition (MOCVD) is another commonly utilized technique for fabrication of ferroelectric/paraelectric thin films which is considered "industry standard". However, the MOCVD growth method has difficulty maintaining film stoichiometry due to the possibility of reaction of the precursor elements in the vapor phase prior to deposition onto the substrate. Precise stoichiometric control of the film is necessary to obtain the desired film composition required for optimum/enhanced dielectric and electrical properties.

BRIEF DESCRIPTION OF THE DRAWINGS

FIGS. 8(a)–(c) display the AES (Augar election spectroscopy) elemental depth profiles of the 750° C. annealed, FIG. 8(a) 1-mol %, FIG. 8(b) 5-mol %, and FIG. 8(c) 10-mol %, La doped $Ba_{0.6}Sr_{0.4}TiO_3$ based paraelectric thin film materials.

DETAILED DESCRIPTION

Figure 1:
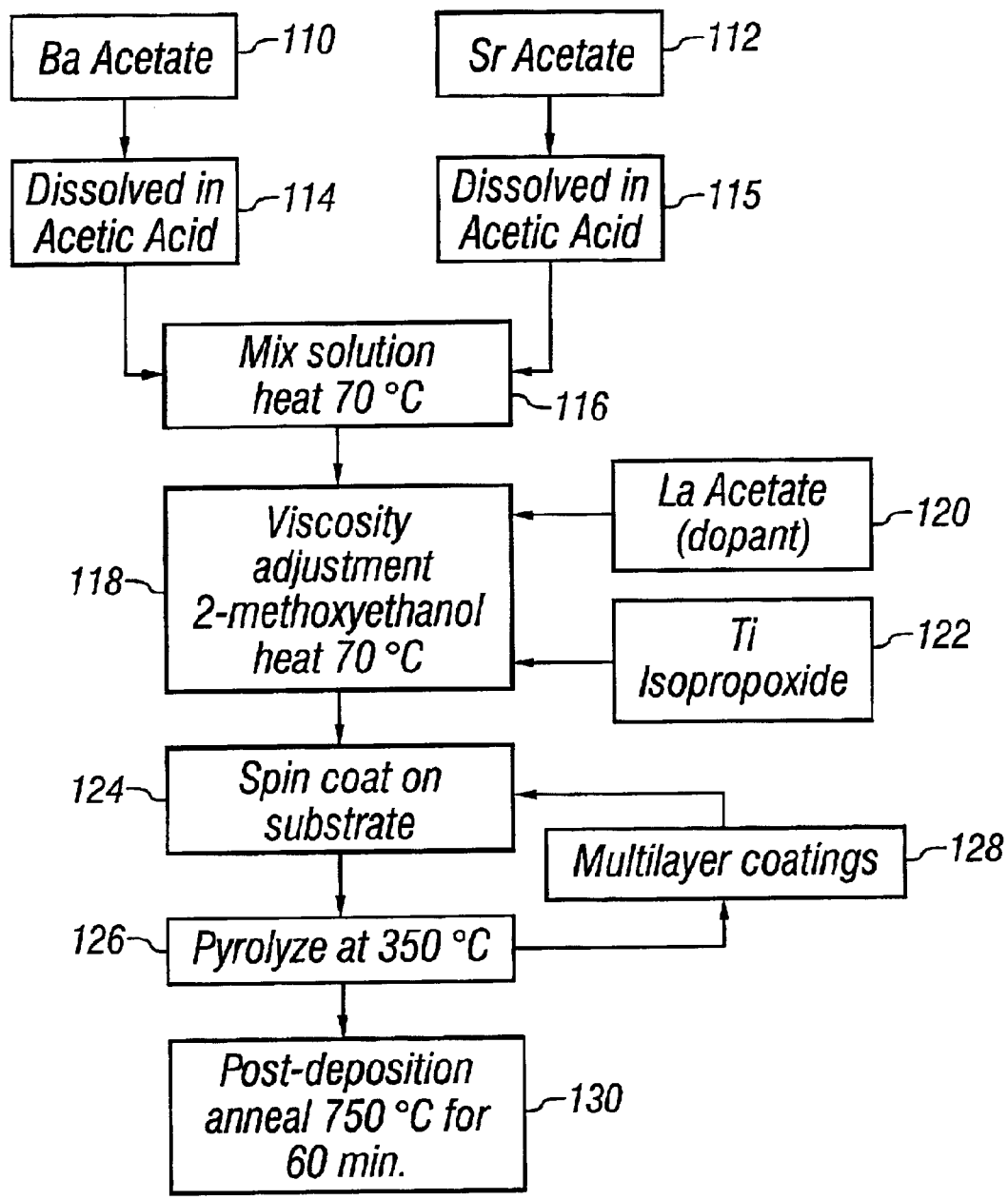
FIG. 1 is a flow diagram illustrating the process of fabrication of a paraelectric thin film material.

The dielectric and insulating properties of ferroelectric/paraelectric thin film materials are strongly influenced by the (1) material design of the thin film i.e., composition, crystallinity, grain size, stress, quality of the film-substrate interface, and (2) the film processing parameters, i.e., film condensation processing technique/processing parameters and post-deposition thermal treatment. Provided is a paraelectric thin film material composition (1-y)$Ba_{0.6}Sr_{0.4}TiO_3$–(y)La, and method of fabrication. In various embodiments y=0 to 10-mol % La. In one embodiment, y=1-mol % La, which has been shown to improve the films dielectric and insulating properties with respect to that of undoped barium strontium titanate (BST) thin films. In particular, material doping has been shown to enhance the thin films dielectric and insulating properties. The La (Lanthanum) dopant has been shown to enhance the insulation resistance (see film resistivity values listed in FIG. 2) of the BST based film, by suppressing the concentration of oxygen vacancies, and growth of potential barrier at grain boundaries. The film fabrication and post deposition thermal treatment also influence the dielectric and insulation properties of the film. The chemical precursor solution deposition process and post deposition annealing treatment developed serve to provide high purity paraelectric thin film materials condensed on large area substrates.

In particular, in one embodiment, a paraelectric thin film material composition, (1-y)$Ba_{0.6}Sr_{0.4}TiO_3$–(y)La with y=1-mol %, provides enhanced dielectric and insulating properties for tunable microwave device applications. Specifically the films composition provides high tunabillity with minimum dielectric loss. The thin film material composition in this embodiment is single phase, with a dense microstructure and minimal defects. The surface morphology of the film is smooth and crack/pin-hole free, and the film-substrate interface maintains thermal stability as a function of processing temperature. A chemical precursor solution deposition process is further provided for fabrication of paraelectric thin film composition which offers ease of processing, high deposition rates, homogeneity (molecular level mixing of chemicals), good stoichiometry control, ease of doping, low processing temperatures, large area pin hole free films, and affordability, thereby being compatible with existing semiconductor technology.

The process for fabrication of undoped and doped BST based paraelectric thin film materials via a chemical solution deposition technique is herein described. The process starts with preparing a precursor solution containing each of the metals in the desired thin film composition. Metal alkoxides or carboxylates, acetate salts are among, but not limited to, possible choices. A single solvent or a combination of solvents are selected to optimize the solubility and solution viscosity. The individual precursors are dissolved in the selected solvents and mixed together to obtain a final homogeneous solution. Hydrolysis and polycondensation of the solution are controlled to stabilize the final solution. The precursor solution is purified, thereby riding it of dust and other particulates/contaminants which are present in the film-processing environment. The precursor solution is then deposited onto an appropriate substrate to form a wet film. The film is then pyrolysed/heated on a hot plate, or in an oven, for removal of organic content. The coat-heating steps are repeated to obtain the desired thickness of the said film. At this point the film is amorphous and post-deposition annealing is performed to impart crystallinity for optimization the films dielectric and electrical properties. Post deposition annealing is performed in an oxygen ambient in order to reduce the oxygen vacancy concentration and improve the dielectric loss.

The specific process for preparation of undoped and La doped BST thin films via a chemical solution deposition technique is described in FIG. 1. Barium (Ba) acetate 110 and strontium (Sr) acetate, 112, each dissolved in acetic acid, 114, 115 respectively, were mixed together and heated to 70° C., 116, in order to control hydrolysis and precipitation. 2-methoxyethanol is utilized, 118, to adjust the viscosity of the solution. Lanthanum (La) acetate, 120, (the dopant precursor, in concentrations ranging from 0 to 10-mol %) and titanium (Ti) isopropoxide, 122, were the final precursors added to the heated solution. Particulates were removed from the final stable solution by filtering through 0.2 $\mu$m syringe filters. The precursor films were deposited onto Pt-coated (Platinum-coated) silicon substrates using a spin coat apparatus, 124, at 4000–6000 rpm for 40 to 90 sec. Subsequent to coating, the films were pyrolized, 126, for 10 min. on a hot plate at 350° C. in order to evaporate solvents and organic addenda and form an inorganic film. The spin coat-pyrolization process was repeated, 128, until a desired film thickness (such as 150 nm) was achieved. Post-deposition annealing, 130, was performed in oxygen ambient at 750° C./60 min.

As shown herein, the fabrication and preparation of a single phase dielectric thin film is performed by providing precursors to form barium strontium titanate in desired amounts in which the precursors consist of Ba acetate, Sr acetate and Ti isopropoxide. Precursors are also provided to form the La dopant, in which the precursor may selectively be La acetate. One or more solvents, such as acetic acid and/or 2-methoxyethanol, are provided to optimize solubility and solution viscosity. The precursor and solvent(s) are mixed to form a stable homogeneous solution (i.e. control hydrolysis and precipitation) whereby Ba acetate and Sr acetate, each dissolved in acetic acid, are mixed together and heated to 70° C. with La acetate and Ti isopropoxide are added as final precursors to the solution. The stable homogenous solution is filtered through syringe filters to purify the solution for removal of dust and particulates.

The solution is deposited onto a suitable substrate forming a continuous film composition $(1-y)\ Ba_{0.6}Sr_{0.4}TiO_3-(y)La$. The continuous film composition is heated and deposited on the substrate to evaporate solvents and organic addenda to form a thin film substrate. The thin film substrate heterostructure may selectively be placed on a hot plate heated at a temperature of 350° C. for 10 min. to form an inorganic film. The depositing of the solution onto a substrate and heating the continuous film composition are selectively repeated to obtain a desired thickness of the continuous thin film. Post deposition annealing (in a furnace) is performed to the thin film substrate heterostructure in oxygen ambient for a selectable time (such as 60 min.) and temperature (such as 750° C.) so as to achieve reasonable dielectric constant which is less than 500, and low dielectric loss with high tunability at microwave frequencies. A chemical precursor solution may selectively be coated onto the substrate via a spin coater apparatus.

In order to evaluate the performance of the film composition designed, the films fabricated by the above described method were characterized for structural, microstructural, compositional, surface morphological, dielectric, and insulating properties. Electrical measurements were conducted in the metal-insulator-metal (MIM) capacitor configuration. MIM capacitors were formed by sputter depositing 0.2 mm Pt (Platinum) dots with 0.5 mm spacings, through a shadow mask covering a $1\times1\ cm^2$ area. Capacitance ($C_p$), dissipation factor (tan $\delta$) and dielectric permitivity ($\epsilon_r$) were measured with a Hewlett-Packard (HP) 4192A impedance/gain analyzer. The insulating properties, leakage current ($I_L$), of the film were evaluated via I–V measurements using a HP 4140B semiconductor test system.

Figures 2, 3:
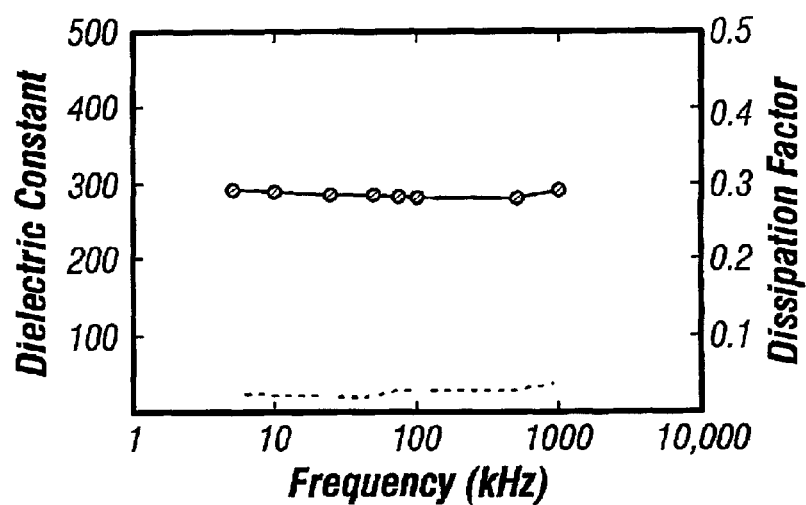
FIG. 2 is a summary table of dielectric and insulating properties for La (Lanthanum) doped $Ba_{0.6}Sr_{0.4}TiO_3$ based paraelectric thin film material.
FIG. 3 is a plot of dielectric constant and dissipation factor as a function of frequency for the 750° C. annealed 1-mol % La doped $Ba_{0.6}Sr_{0.4}TiO_3$ paraelectric thin film material.

The dielectric and insulating measurements of the 750° C. annealed undoped $Ba_{0.6}Sr_{0.4}TiO_3$ (BST) and La doped BST films were conducted at room temperature on metal-insulator-metal (MIM) capacitors. FIG. 2 summarizes the dielectric constant ($\epsilon_r$), dissipation factor (tan $\delta$), dielectric tunability, and resistivity ($\rho$) values for the undoped and La doped BST films. The values reported in FIG. 2 show that La doping had a strong influence on the material properties of the BST thin films. The dielectric constant, dissipation factor, tunability, and leakage current (film resistivity increased) all decreased as the La concentration increased from 0 to 5-mol %. The dissipation factor of the 1 and 5-mol % La doped BST films (tan $\delta\sim0.01$) was lower than that of the undoped BST thin film (tan $\delta>0.025$). The dissipation factor of the 10-mol % La doped film (tan $\delta\sim0.03$) was significantly higher than that of the 1 and 5-mol % La doped BST thin films. FIG. 3 displays the dielectric response as a function of measured frequency for the 1-mol % La doped BST film. The dielectric properties did not show any appreciable dispersion with measured frequency up to 1 MHz indicating good film quality and the absence of internal interfacial barriers.

Figure 4:
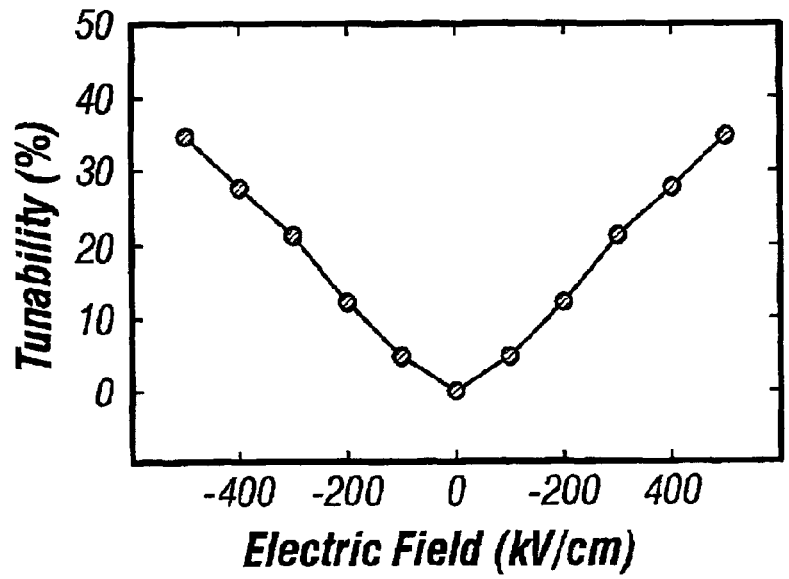
FIG. 4 is a plot of tunability of the 1-mol % La doped $Ba_{0.6}Sr_{0.4}TiO_3$ based paraelectric thin film material as a function of applied electric field.

The electrical quality, that is, the insulating nature, of a dielectric film is determined by the value of leakage current which has been converted to resistivity in FIG. 2. The La doped BST thin films possessed enhanced insulating behavior with respect to that of the undoped BST thin film composition. The film resistivity of the La doped films was over two orders of magnitude larger than that of undoped BST. Capacitance-voltage (C-V) measurements, conducted on the MIM capacitors, were utilized to analyze the effect of La content on the tunability of the BST based thin films. The tunability of the capacitance was measured in terms of $\Delta C/C_o$, where $\Delta C$ is the change in capacitance relative to zero-bias capacitance $C_o$. The tunability, measured at 200 kV/cm was found to decrease as a function of increasing La concentration from 28.1% to 1.2% for the undoped and 10-mol % La doped BST films respectively. FIG. 4 shows the tunability of the 1-mol % La doped film as a function of applied electric fields. The 1-mol % La doped thin film was found to be highly tunable as a function of increasing applied electric fields. Specifically, the tunability varied from 0 to 35% at applied electric fields of 0 to 500 kV/cm, respectively.

Selection of the film composition for reliable tunable device applications requires careful evaluation of the properties reported in FIGS. 2–4. Desirable material properties for tunable device applications include: low dielectric loss, a high dielectric constant which less than 500, high dielectric tunability, and low leakage current/high film resistivity. Considering the tradeoffs between tunability and the values of dissipation factor, dielectric constant and film resistivity, the 1-mol % La doped BST film possessed the best overall properties for use in tunable device applications. The high tunability ($\Delta C/C_o=35\%$ @ 500 kV/cm) and excellent film resistivity ($\rho \geq 31.4\times10^{13}\ \Omega\text{-cm}$) combined with the low dissipation factor (tan $\delta\sim0.01$) suggests the 1-mol% La doped BST is an attractive material for tunable components and devices. However, it must be kept in mind that good dielectric and insulating properties are not stand-alone requirements. Other materials properties such as film structure, microstructure, surface morphology, and nature of the film-substrate also influence device performance and long term reliability.

Figure 5:
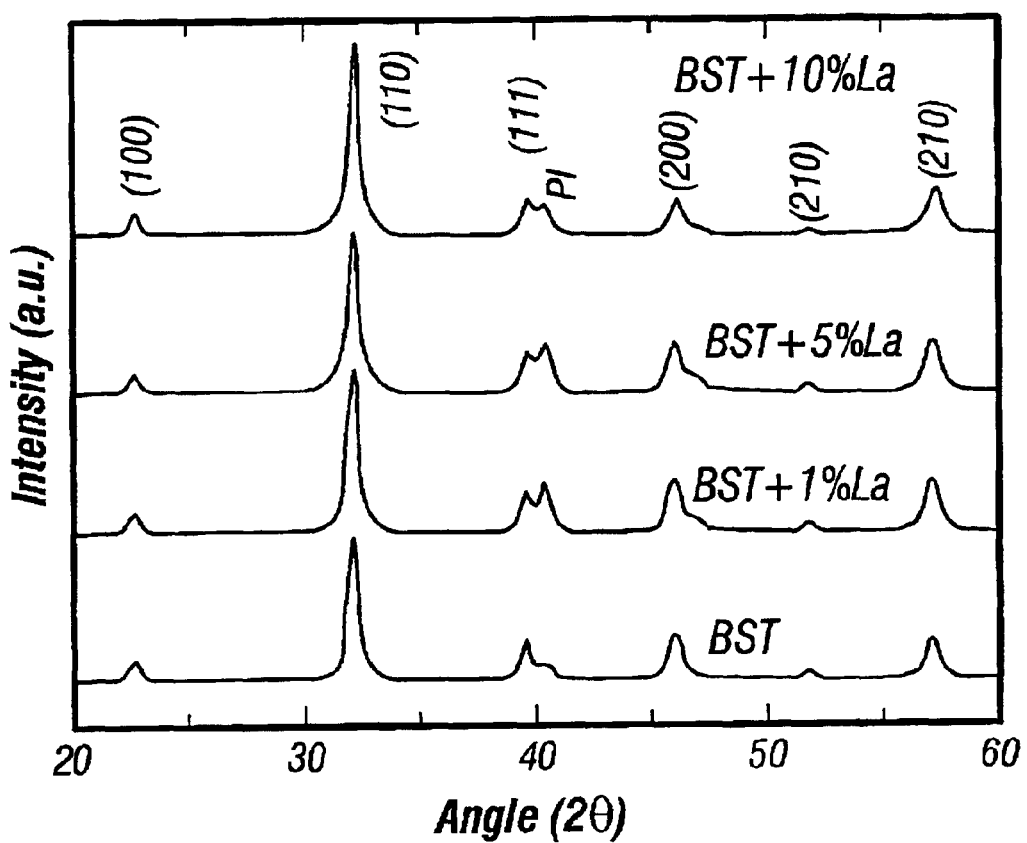
FIG. 5 displays x-ray diffraction patterns of undoped and La doped $Ba_{0.6}Sr_{0.4}TiO_3$ based thin films annealed at 750° C. for 60 min.
Figure 6A:
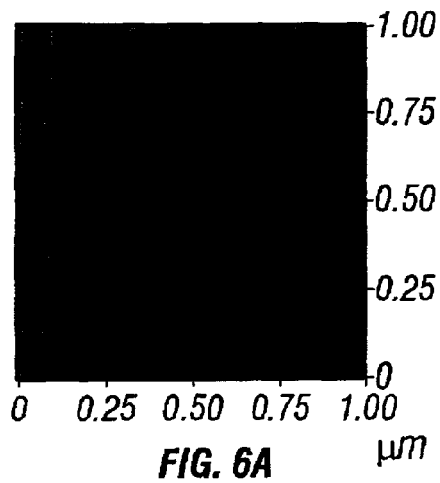
FIGS. 6(a)–(d) display the AFM (atomic force microscopy) micrographs of the 750° C. annealed, FIG. 6(a) undoped, FIG. 6(b) 1-mol %, FIG. 6(c) 5-mol %, and FIG. 6(d) 10-mol %, La doped $Ba_{0.6}Sr_{0.4}TiO_3$ based thin films.
Figure 6B:
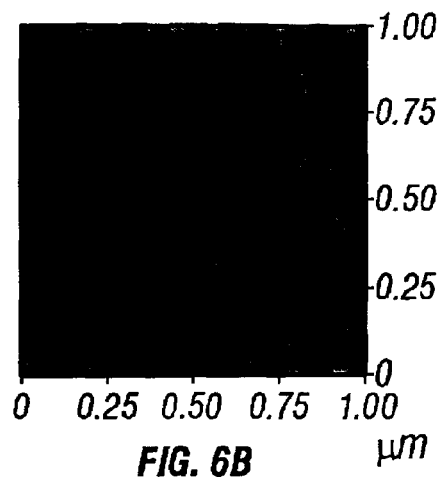
Figure 6C:
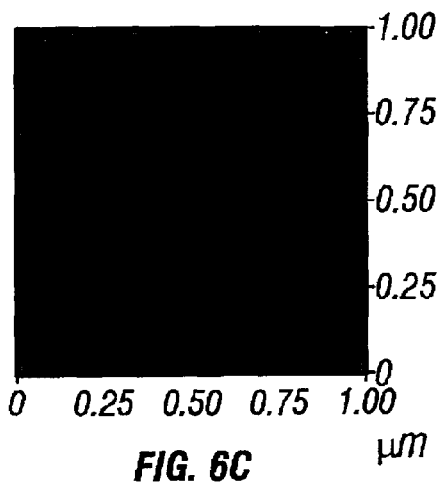
Figure 6D:
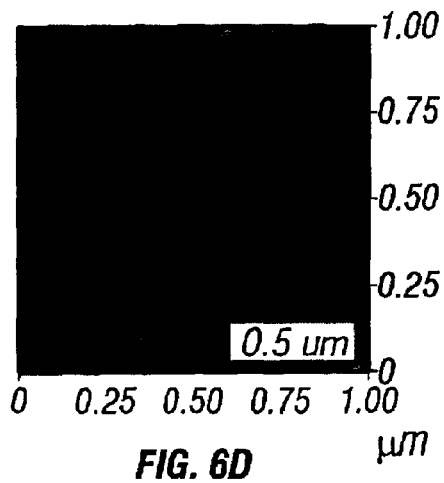

In order to insure optimum/enhanced and accurate dielectric properties, long-term device reliability, and fabrication reproducibility, the annealed doped BST thin films should be well crystallized and possess a single-phase structure. Glancing angle x-ray diffraction (GAXRD) was utilized to assess the film crystallinity and to determine whether or not the films possessed a single-phase structure. The as-pyrolysed undoped and 1–10 mol % La doped BST thin films were amorphous and post deposition annealing was performed to impart crystallinity, increase the overall grain size of the film, and to remove film strain by filling oxygen vacancies. These factors are particularly important since the dielectric loss in ferroelectric thin films has been seen to be strongly influenced by stoichiometric deficiencies, which create vacancies, film strain, and the presence of a large grain boundary to grain ratio. Therefore, in order to reduce the microwave dielectric loss, the as-pyrolysed films were post-deposition annealed for 1 hour at 750° C. in an oxygen atmosphere. FIG. 5 displays the x-ray diffraction patterns of the 750° C. annealed undoped BST and La doped BST thin films. All films possessed a non-textured polycrystalline structure with no evidence of secondary phase formation. The full-width-half-maximum (FWHM) of the most intense diffraction peaks increased with increasing La content. This peak broadening is indicative of a decrease in grain size.

The average surface roughness ($R_{av}$) as quantified by atomic force microscopy (AFM), was determined to $R_{av}$=1.5 nm at 750° C. for all film compositions. The parameter of film surface roughness is extremely important for device performance since the dielectric properties depend not only on a well-defined microstructure, but also on the quality of the electrode-film interface. The film surface preferably is metallized in device fabrication. It has been seen that surface roughness has a strong influence on the value of leakage current or film resistivity. The fact that the undoped and La doped films are extremely smooth is consistent with the excellent film resistivity values reported in FIG. 2. The surface morphology of the La doped films was smooth and crack/pin-hole free as determined by AFM and field emission scanning microscopy (FESEM) analysis. These smooth film surfaces demonstrated excellent adhesion with the Pt electrodes in the MIM capacitor test structures.

The AFM images displayed in FIGS. 6(a)–(d) show that both the undoped and doped films exhibited a dense microstructure which was modified by the addition of La. The grain size was found to decrease with increasing La content, which is consistent with the GAXRD studies where the peak sharpness decreased with increasing La content. Specifically, the undoped (FIG. 6(a)) and 1-mol % La doped (FIG. 6(b)) BST films exhibited a uniform microstructure with an average grain size of 60 nm and 50 nm respectively. The 5 and 10-mol % La doped films (FIGS. 6(c) and 6(d) respectively) possessed a non-uniform grain structure with average grain sizes of 30 nm and 22 nm respectively. A non-uniform grain size-structure is indicative of either (1) a multi-phase film or (2) immature film crystallinity, that is, the film was not fully crystallized at the present annealing temperature/time. Since the x-ray diffraction measurements demonstrated the 1, 5, and 10 mol % La doped films to be single phase, it is suggested that the 5 and 10-mol % La doped BST films require a higher annealing temperature and/or longer annealing time at 750° C. in order to achieve the grain real uniformity which is indicative of a fully developed single phase crystalline microstructure. Thus, La doping of BST thin films at concentrations ≧5 mol % appears to elevate the thermal treatment required for complete film crystallization with respect to that of pure or lightly doped (1-mol %) BST based thin films.

Figure 7A:
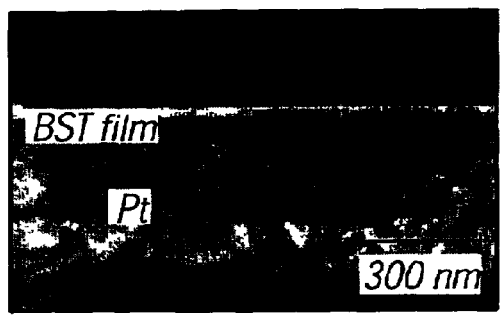
FIGS. 7(a)–(d) display the field emission scanning microscopy (FESEM) images of the 750° C. annealed, FIG. 7(a) undoped, FIG. 7(b) 1-mol %, FIG. 7(c) 5-mol %, and FIG. 7(d) 10-mol %, La doped $Ba_{0.6}Sr_{0.4}TiO_3$ based paraelectric thin film materials.
Figure 7B:
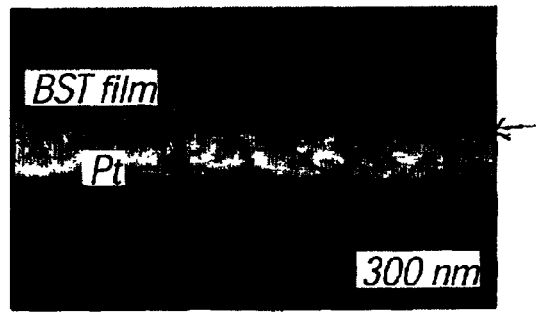
Figure 7C:
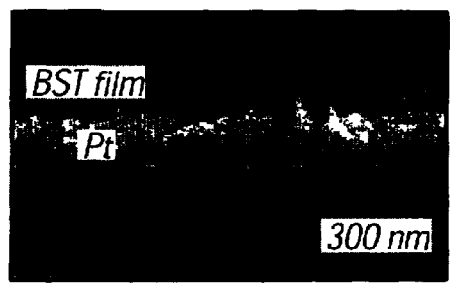
Figure 7D:
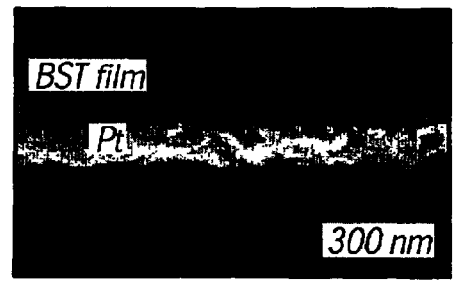

The cross-sectional FESEM microstructural analysis of the undoped and La doped BST films support the AFM results. The FESEM data (FIG. 7) shows that the undoped and 1-mol % La doped films (FIGS. 7(a) and 7(b) respectively) possessed a well crystallized, dense, void free microstructure composed of granular multi-grains randomly distributed throughout the film thickness. The small arrows in FIGS. 7(a)–7(d) denote the film-Pt interfaces. In contrast, the 5 and 10-mol % La doped films (FIGS. 7(a) and 7(b) respectively) possessed under developed microstructures with respect to that of the pure and 1 mol % La doped films. It has been seen that the dielectric properties of the BST based material system are influenced by film composition, crystallinity, grain size, stress, and the quality of the film-substrate interface. Since the 5 and 10-mol % La doped films were not fully crystallized after annealing at 750° C. the dielectric properties reported in FIG. 2 do not reflect the true dielectric properties of these films. Thus, after an elevated thermal treatment (annealing temperature greater than 750° C. and/or more than 60 min. annealing time at 750° C.) the dielectric properties of the 5 and 10 mol % La doped films reported in FIG. 2 should improve.

The film-substrate interfacial quality (structure and composition) strongly influences the dielectric properties. The cross-sectional FESEM images of the La doped films (FIGS. 7(a)–7(d)), revealed a structurally well-delineated film-Pt electrode interface at all doping concentrations. No amorphous layer or voiding was observed at the interface between the film and the bottom electrode. The film-Pt interfacial quality, exemplified for the 1-mol % La doped BST film, is responsible for the non-dispersive nature of the permittivity within measured frequency up to 1 MHz as indicated in FIG. 3. Additionally, this defect free and structurally abrupt interface bodes well for the excellent mechanical integrity and good adhesion characteristics of the film-PtSi substrate at all doping levels. The compositional film-Pt substrate integrity was evaluated via Auger electron spectroscopy (AES) elemental depth profiles.

Figure 8A:
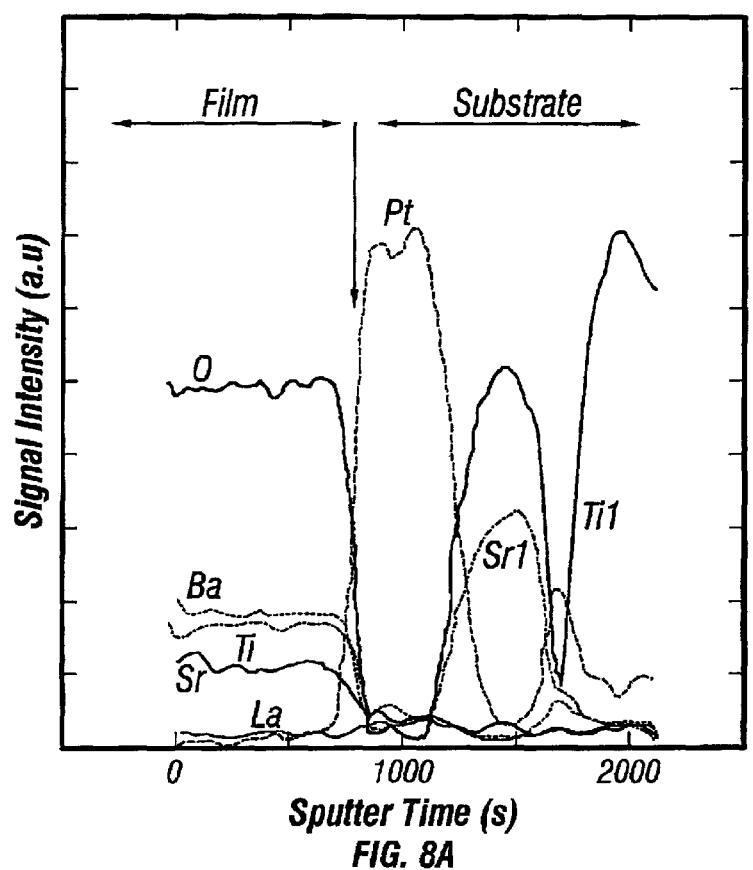

The AES depth profiles of the 750° C. annealed 1–10 mol % La doped BST films are displayed in FIGS. 8(a)–(c). For all doping levels, the AES depth profiles revealed a compositionally sharp interface with no interdiffusion of constituent elements between the dielectric film and the Pt electrode. In referring to FIGS. 8(a)–8(c), the elemental signals in the AES spectra are delineated by a solid line for O (oxygen), small dotted line for Ba, small dashed line for Sr, large dotted line for La, dashed-dotted line for Ti, and large dashed line for Pt. Film-substrate indiffusion leads to undesirable interfacial phases which alter the dielectric properties of the film. In other words, interdiffusion causes the film to become multi-phase and the dielectric properties of the pure paraelectric film will degrade due to the addition of one or more non-perroelectric interface phase(s). The depth profiles also revealed that each element component of the film possessed a uniform distribution from the film surface to the interface of the bottom Pt electrode substrate. These data substantiate the fact that the film and platinized-silicon substrate maintain chemical and thermal stability at processing temperatures up to 750° C. (the annealing temperature). Since the 5 and 10-mol % La doped films (FIGS. 8(b) and 8(c) respectively) were not fully crystallized at 750° C., the AES analyses at this temperature sheds little information on the actual thermal stability of these films. Considering validity of the AES data for only the 1-mol % La doped BST film (FIG. 8(a)) (thermally stable film-PtSi interface), the fact that no impurities (no elemental interdiffusion) were observed in the AES elemental depth profile, contributed to the films good dielectric and insulating properties reported in FIG. 2.

Considering the structural, surface morphological, microstructural and film-substrate interfacial properties evaluated above, validity of the reported dielectric properties is realized only for the undoped and 1-mol % La doped BST thin films. Since the film crystallinity of the 5 and 10-mol % La doped BST films was not fully developed after the annealing treatment this indicates that the dielectric properties of theses films, reported in FIG. 2, are not the optimized properties. These results demonstrate that at concentrations of 1-mol %, La doping serves to improve the films dielectric loss, lower the dielectric constant and increase the film resistivity with respect to that of undoped BST. The tunability, 12.1% at 200 kV/cm, was much lower than tunable devices demand, however, the results demonstrated (FIG. 4) that the film tunability was elevated to 35% by applying a higher field strength (E=500 kV/cm). This applied field strength translates to an applied bias of 7.5 V which is still compatible with the voltage requirements of present semiconductor based systems (<10 V) and well below the films dielectric breakdown. The 1-mol % La doping (composition modification), strongly influenced the attainment of the enhanced thin film material properties shown in FIG. 2. Material doping as designed in this invention, enhanced the thin film dielectric and insulating properties. The La dopant served to enhance the insulation resistance (excellent film resistivity values listed in FIG. 2) of the BST based film, by suppressing the concentration of oxygen vacancies, and growth of potential barrier at grain boundaries.

After reading the foregoing specification, one of ordinary skill will be able to effect various changes, substitutions of equivalents and various other aspects of the present invention as broadly disclosed herein. It is therefore intended that the protection granted hereon be limited only by the definition contained in the appended claims and equivalents thereof.

Having thus shown and described what is at present considered to be embodiments of the present invention, it should be noted that the same has been made by way of illustration and not limitation. Accordingly, all modifications, alterations and changes coming within the spirit and scope of the invention are herein meant to be included.

We claim:

1. A method of preparing a dielectric thin film material comprising:

providing precursors to form barium strontium titanate;

providing a lanthanum (La) dopant;

mixing the precursors and La dopant with at least one solvent to form a solution; and depositing the solution onto a substrate and forming a continuous film composition.

2. The method of claim 1 further comprising the step of forming the continuous film with a composition of $(1-y)Ba_{0.6}Sr_{0.4}TiO_3-(y)La$ with y=0 to 10-mol %.

3. The method of claim 2 further comprising the step of providing y=1-mol %.

4. The method of claim 2 further comprising the step of heating the continuous film composition deposited on the substrate to evaporate solvents and form a thin film substrate.

5. The method of claim 4 further comprising repeating the steps of depositing and heating to obtain a desired thickness of the continuous film composition.

6. The method of clam 4 further comprising the step of annealing the thin film substrate in oxygen at a selectable temperature and time to achieve dielectric constant which is less than 500, and low dielectric loss with high tunability.

7. The method of claim 6 further comprising the step of coating a chemical precursor solution on to the substrate via a spin coater apparatus.

8. The method of claim 6 further comprising the step of forming the continuous film to be a single phase dielectric thin film having a smooth surface morphology ($R_{av}$<2 nm) and that is substantially free of cracks and pin-holes.

9. The method of claim 6 further comprising the step of placing the thin film substrate an a hot plate to form an inorganic film.

10. The method of claim 6 further comprising the step of filtering the solution through syringe filters.

11. The method of claim 6 further comprising providing the precursors to consist of: Ba acetate, Sr acetate, and Ti isopropoxide, and providing the dopant to consist of La acetate.

12. The method of claim 11 further comprising providing the at least one solvent to consist of at least one of acectic acid and 2-methoxyethanol, dissolving the Ba acetate and Sr acetate in acetic acid, heating the dissolved Ba acetate and Sr acetate to form a heated solution, and adding the La acetate and Ti isopropoxide to the heated solution.

13. A dielectric thin film comprising a composition of: $(1-y)Ba_{0.6}Sr_{0.4}TiO_3-(y)La$, where 0 mol %<y<10 mol %.

14. The dielectric thin film of claim 13 in which y=1 mol %.

15. The dielectric thin film of claim 13 in which the composition provides at least one of: (a) high tunability with $\Delta C/C_o$ proximate to 35% at field strength of E=500 kV/cm, (b) low dielectric loss (tan δ~0.01), (c) resistivity greater than or equal to $31.4 \times 10^{13}$ Ω-cm and (d) a dielectric constant less than 500.

16. The dielectric thin film of claim 13 formed on a substrate by mixing said thin film with an La dopant and at least one solvent to establish a solution which is deposited on a substrate forming a continuous film composition.

17. The dielectric thin film formed on a substrate of claim 16 subjected to a heat treatment to form a thin film substrate heterostructure.

18. The dielectric thin film of claim 17 in which the thin film substrate heterostructure is annealed at a selectable time and temperature to achieve a dielectric constant which is less time 500.

19. The dielectric thin film of claim 13 in which the dielectric thin film comprise a single phase dielectric thin film having a smooth morphology and is substantially free of cracks and pin holes.

* * * * *